(12) United States Patent
Sekine

(10) Patent No.: US 11,776,974 B2
(45) Date of Patent: Oct. 3, 2023

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventor: Hiroshi Sekine, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 22 days.

(21) Appl. No.: 16/912,394

(22) Filed: Jun. 25, 2020

(65) Prior Publication Data

US 2020/0411572 A1 Dec. 31, 2020

(30) Foreign Application Priority Data

Jun. 28, 2019 (JP) .................................. 2019-121950

(51) Int. Cl.
| | | |
|---|---|---|
| *H01L 27/146* | (2006.01) | |
| *H01L 27/148* | (2006.01) | |
| *H04N 25/59* | (2023.01) | |
| *H04N 25/75* | (2023.01) | |
| *H04N 25/71* | (2023.01) | |

(52) U.S. Cl.
CPC .. *H01L 27/14612* (2013.01); *H01L 27/14603* (2013.01); *H01L 27/14627* (2013.01); *H01L 27/14831* (2013.01); *H04N 25/59* (2023.01); *H04N 25/745* (2023.01); *H04N 25/75* (2023.01)

(58) Field of Classification Search
CPC ......... H01L 27/14612; H01L 27/14603; H01L 27/14627; H01L 27/14831; H01L 27/14641; H01L 27/14621; H04N 5/3559; H04N 5/3765; H04N 5/378; H04N 5/36961; H04N 5/37457; H04N 25/59; H04N 25/745; H04N 25/75; H04N 25/704; H04N 25/778
See application file for complete search history.

(56) References Cited

U.S. PATENT DOCUMENTS

| | | | | |
|---|---|---|---|---|
| 8,648,939 | B2* | 2/2014 | Okuno | .............. H01L 27/14609 348/246 |
| 8,917,341 | B2* | 12/2014 | Sakano | .............. H04N 5/37452 348/308 |
| 9,060,145 | B2* | 6/2015 | Kato | ................. H01L 27/14643 |
| 2006/0219868 | A1* | 10/2006 | Morimoto | ......... H01L 27/14609 250/208.1 |
| 2008/0173909 | A1 | 7/2008 | Parks | |
| 2009/0045319 | A1 | 2/2009 | Sugawa | |

(Continued)

FOREIGN PATENT DOCUMENTS

JP 2015-233185 A 12/2015

*Primary Examiner* — Shahbaz Nazrul
(74) *Attorney, Agent, or Firm* — Canon U.S.A., Inc., IP Division

(57) ABSTRACT

A photoelectric conversion apparatus includes a photoelectric conversion portion, an amplification transistor having an input node, a first transfer transistor, a second transfer transistor arranged between the first transfer transistor and the input node, and a reset transistor connected to the input node. When electric charges are transferred from the photoelectric conversion portion to the input node, the photoelectric conversion apparatus switches a capacity value of the input node by controlling the second transfer transistor to be on or off.

15 Claims, 15 Drawing Sheets

(56) References Cited

U.S. PATENT DOCUMENTS

| | | | |
|---|---|---|---|
| 2012/0327278 A1* | 12/2012 | Oike | H04N 3/1568 |
| | | | 348/294 |
| 2017/0353675 A1 | 12/2017 | Onuki | |
| 2018/0376083 A1 | 12/2018 | Ikuma | |
| 2020/0185435 A1* | 6/2020 | Iwakura | H01L 27/14603 |
| 2020/0404199 A1* | 12/2020 | Boukhayma | H04N 5/35527 |

* cited by examiner

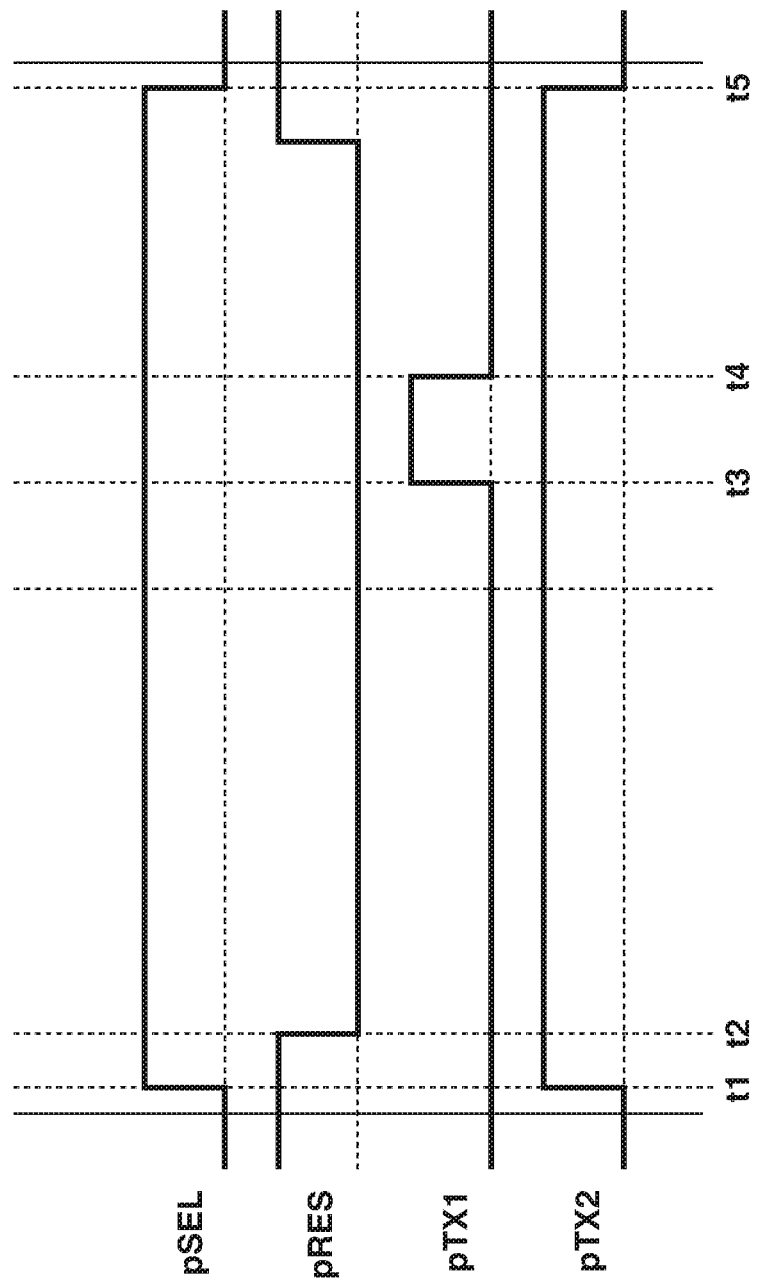

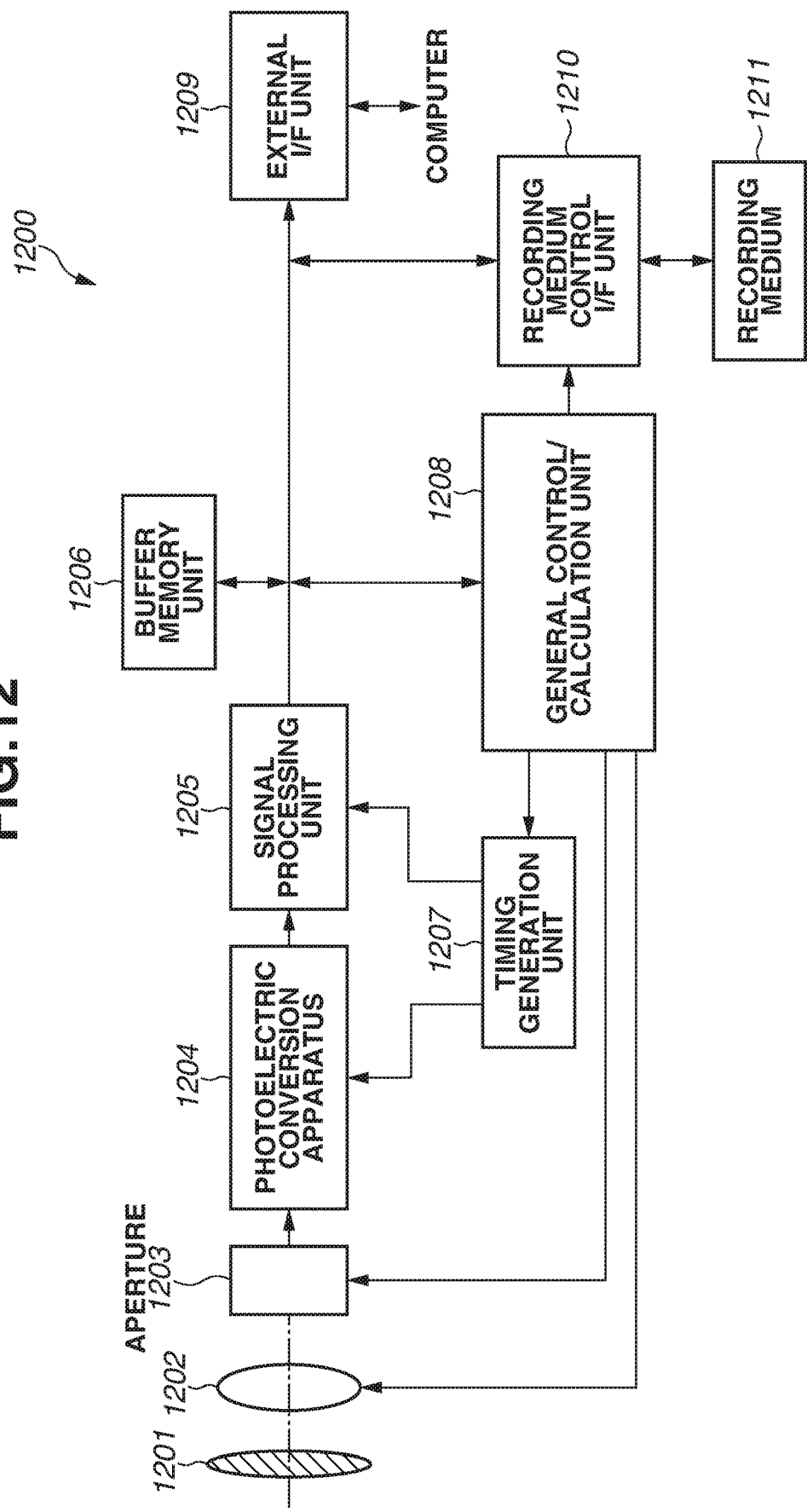

FIG.13B
FRONT VIEW
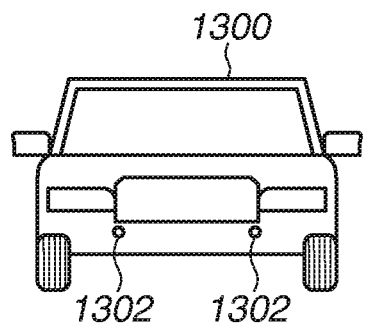
TOP VIEW
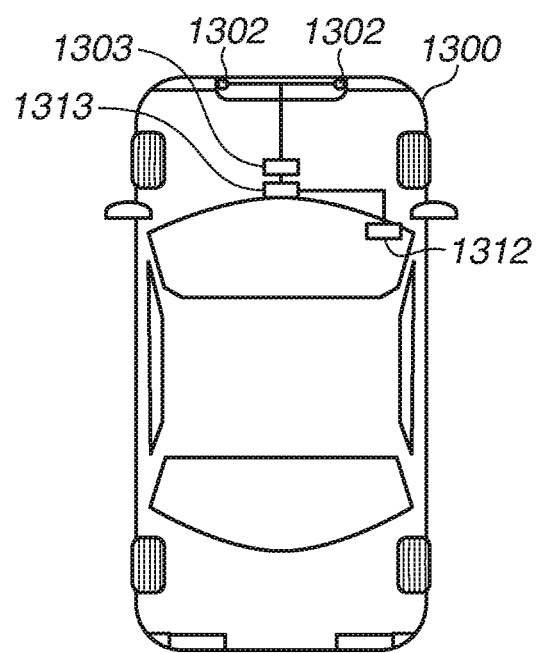
REAR VIEW
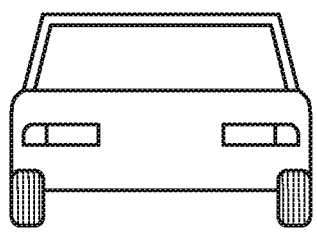

PHOTOELECTRIC CONVERSION APPARATUS, PHOTOELECTRIC CONVERSION SYSTEM, AND MOVING BODY

BACKGROUND

Field

The present disclosure relates to a photoelectric conversion apparatus, a photoelectric conversion system, and a moving body.

Description of the Related Art

United States Patent Application Publication No. 2008/173909 discusses a configuration of a photoelectric conversion apparatus which includes a transistor for increasing a capacity in order to expand a dynamic range thereof. In the configuration, one end of the transistor for increasing a capacity is connected to an input node of an amplification transistor, and the other end thereof is connected to a reset transistor. One end of the reset transistor is connected to the transistor for increasing a capacity, and the other end thereof is supplied with a power source voltage (VDD).

However, according to the configuration discussed in United States Patent Application Publication No. 2008/173909, when a potential of the input node is to be reset, a gate of the transistor for increasing a capacity and a gate of the reset transistor need to be turned on. In the configuration discussed in United States Patent Application Publication No. 2008/173909, a plurality of gates is arranged between the other end of the reset transistor which is supplied with the power source voltage and the input node. Therefore, a gate length thereof tends to be longer, compared to a case where a single gate is arranged thereon. Accordingly, there is a possibility that reset performance is lowered because of resistance generated by the gates, so that the input node cannot be reset to a predetermined potential.

SUMMARY

According to an aspect of the embodiments, a photoelectric conversion apparatus includes a photoelectric conversion portion, an amplification transistor, a first transfer transistor, a second transfer transistor, and a reset transistor. The amplification transistor has an input node to which electric charges generated by the photoelectric conversion portion are input. The first transfer transistor is configured to control transfer of the electric charges received from the photoelectric conversion portion. The second transfer transistor is arranged between the first transfer transistor and the input node. The reset transistor is connected to the input node. When electric charges are transferred from the photoelectric conversion portion to the input node, the photoelectric conversion apparatus switches a capacity value of the input node by controlling the second transfer transistor to be on or off.

According to another aspect of the embodiments, a photoelectric conversion apparatus includes a first semiconductor region, a second semiconductor region, an amplification transistor, and a first transfer transistor. The first semiconductor region is of a first conductive-type where electric charge of a first polarity same as a polarity of signal charge is a majority carrier. The second semiconductor region is of the first conductive-type to which electric charges accumulated in the first semiconductor region is transferred. The amplification transistor has an input node formed by the second semiconductor region. The first transfer transistor includes the first semiconductor region and the second semiconductor region. The second semiconductor region forms a source or a drain of a reset transistor, and a gate of a second transfer transistor is arranged to overlap with the second semiconductor region in a planar view.

Further features of the disclosure will become apparent from the following description of exemplary embodiments with reference to the attached drawings.

BRIEF DESCRIPTION OF THE DRAWINGS

FIG. 7 is a timing chart illustrating read-out processing according to a second exemplary embodiment.

FIG. 12 is a block diagram illustrating a photoelectric conversion system according to a fifth exemplary embodiment.

FIGS. 13A and 13B are schematic diagrams respectively illustrating a photoelectric conversion system and a moving body according to a sixth exemplary embodiment.

DESCRIPTION OF THE EMBODIMENTS

Figure 1:
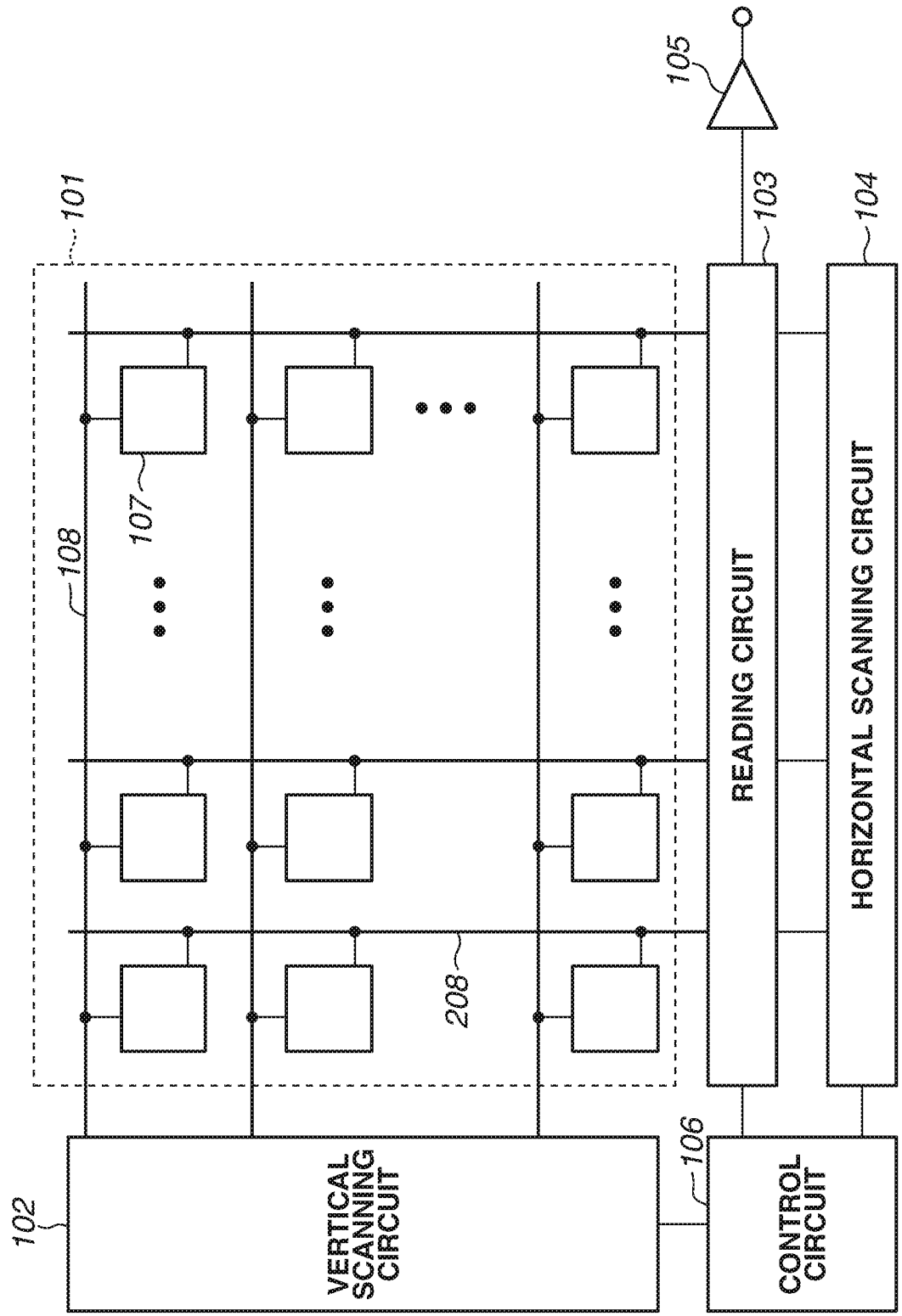
FIG. 1 is a block diagram illustrating a photoelectric conversion apparatus according to a first exemplary embodiment.

The below-described exemplary embodiments merely embody a technical spirit of the disclosure, and are not intended to limit the present disclosure. In the respective drawings, in order to provide a clear description, sizes and a positional relationship of members may be illustrated with exaggeration. In the below-described exemplary embodiments, components similar to those described once will be given the same reference numerals, and descriptions thereof will be omitted.

In below descriptions, it is assumed that an electron serves as a signal carrier (signal charge). An N-type semiconductor region is provided as a first conductive-type semiconductor region where a carrier of a first polarity is a majority carrier, and a P-type semiconductor region is provided as a second conductive-type semiconductor region where a carrier of a second polarity is a majority carrier. The below-described exemplary embodiments can be also implemented in a case where a positive hole serves as the signal carrier. In such a case, the P-type semiconductor region is provided as the first conductive-type semiconductor region, and the N-type semiconductor region is provided as the second conductive-type semiconductor region.

In the below-described exemplary embodiments, the same reference numerals are applied to elements and circuits having similar functions, and different symbols are added to trailing ends thereof in order to distinguish one from another. If it is not necessary to distinguish one from another, a portion common to each other will be described with the trailing symbols, such as "a" and "b", omitted.

Hereinafter, unless otherwise specified, exemplary embodiments will be described based on a premise that an N-type metal-oxide-semiconductor (MOS) transistor is used as a transistor that constitutes a pixel. A state where the transistor is on refers to a state where a high-level (H-level) control signal is input to the N-type MOS transistor, so that the N-type MOS transistor is brought into a conduction state. A state where the transistor is off, on the other hand, refers to a state where a low-level (L-level) control signal is input to the N-type MOS transistor, so that the N-type MOS transistor is brought into a non-conduction state.

In addition, a P-type MOS transistor may be used instead of the N-type MOS transistor. In this case, the configuration may be changed as appropriate, e.g., a potential opposite to a potential of the N-type MOS transistor is applied when a control signal is supplied to the P-type MOS transistor. Further, in each of the exemplary embodiments, a connection relationship between circuit elements is described. However, a configuration thereof can be changed as appropriate, e.g., another element, such as a switch and a buffer, may be placed therebetween.

FIG. 1 is a block diagram illustrating a schematic configuration of a photoelectric conversion apparatus according to a first exemplary embodiment. The photoelectric conversion apparatus includes a unit cell which detects light and outputs a signal. The photoelectric conversion apparatus according to the present exemplary embodiment includes a pixel as a unit cell, and is capable of executing image capturing. A photoelectric conversion apparatus that is not configured to execute image capturing according to the present exemplary embodiment can also produce a technical effect. A range finding sensor and a photometric sensor are given as the examples of the photoelectric conversion apparatus not configured to execute image capturing. The range finding sensor is a sensor such as a time of flight (TOF) sensor, which is typically used for generating distance information indicating a distance to an object. The photometric sensor is a sensor typically used for detecting brightness of an object.

The photoelectric conversion apparatus in FIG. 1 includes a pixel array unit 101, a vertical scanning circuit 102, a reading circuit 103, a horizontal scanning circuit 104, an output circuit 105, and a control circuit 106.

The pixel array unit 101 includes a plurality of pixels 107 arranged in a row direction and a column direction. A light-shielded optical black pixel or a dummy pixel which does not output a signal may be arranged in the pixel array unit 101 in addition to a pixel for detecting an image capturing signal.

The vertical scanning circuit 102 supplies a control signal for switching between an on state (conduction state) and an off state (non-conduction state) of transistors within the pixels 107. A control signal line 108 for supplying a control signal is arranged for each of pixel rows. The plurality of pixels 107 arranged in one pixel row is connected to one control signal line 108.

The vertical scanning circuit 102 supplies a control signal to the plurality of pixels 107 arranged in the pixel rows upon receipt of a signal from the control circuit 106.

The reading circuit 103 executes signal processing such as amplification processing and analog-to-digital (A/D) conversion processing with respect to pixel signals output to a vertical output line 208. The reading circuit 103 executes correlated double sampling processing based on the signal output when the pixels 107 are reset and a signal output when photoelectric conversion is executed.

The horizontal scanning circuit 104 supplies a control signal to the reading circuit 103. The control signal supplied from the horizontal scanning circuit 104 causes a pixel signal processed by the reading circuit 103 to be transferred to the output circuit 105. The output circuit 105 outputs the signal to a signal processing unit provided outside the photoelectric conversion apparatus. The control circuit 106 is a circuit, such as a timing generator, which controls each of the circuits. The control circuit 106 supplies control signals for controlling the operations and operation timings of the vertical scanning circuit 102, the reading circuit 103, the horizontal scanning circuit 104, and the output circuit 105. At least a part of the control signals supplied to the vertical scanning circuit 102, the reading circuit 103, the horizontal scanning circuit 104, and the output circuit 105 may be supplied from the outside of the photoelectric conversion apparatus instead of being supplied from the control circuit 106.

Figure 2:
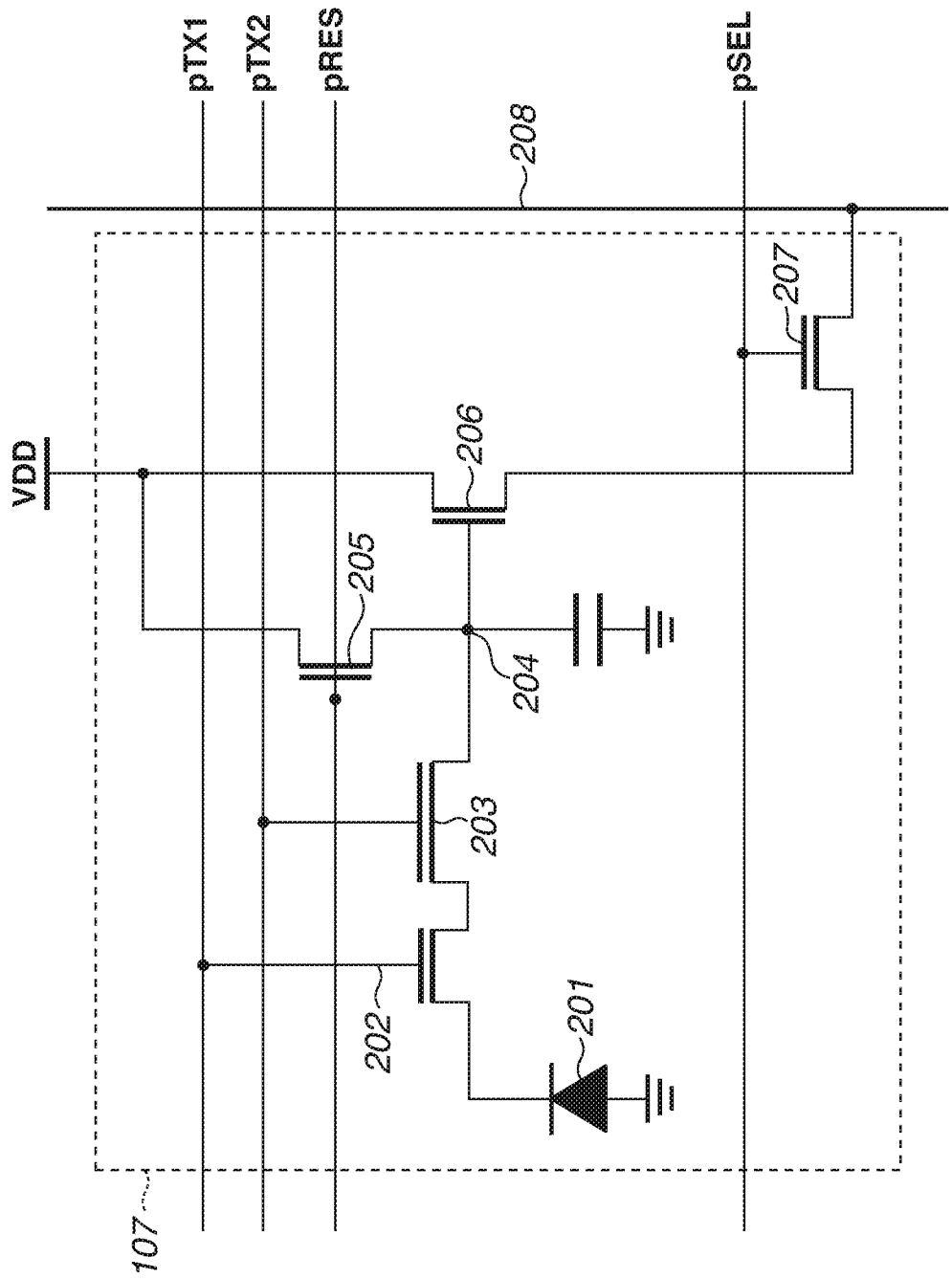
FIG. 2 is a diagram illustrating a circuit configuration of a pixel according to the first exemplary embodiment.

FIG. 2 is a schematic circuit diagram relating to the pixels 107 of the photoelectric conversion apparatus according to the present exemplary embodiment. In FIG. 2, a configuration of one pixel 107 is illustrated, and the rest of the pixels 107 are omitted.

In FIG. 2, the pixel 107 includes a photoelectric conversion portion 201, a first transfer transistor 202, a second transfer transistor 203, an amplification transistor 206, a floating diffusion (FD) portion 204, a reset transistor 205, and a selection transistor 207. The FD portion 204 is an input node of the amplification transistor 206. For example, each of the transistors is configured of a metal-oxide semiconductor field-effect transistor (MOSFET), and includes a gate serving as a control electrode arranged between a drain and a source in a planar view.

Although a photodiode is used as the photoelectric conversion portion 201 for example, an optional configuration such as an organic photoelectric conversion film or an organic photogate can be also used. The amplification transistor 206 outputs a signal based on the potential of the input node to the selection transistor 207. For example, one end of the amplification transistor 206 is connected to a power source voltage VDD. The amplification transistor 206 is provided as a part of a source follower circuit, and a gate of the amplification transistor 206 is the input node. The photoelectric conversion portion 201 and the input node are connected to each other via the first transfer transistor 202 and the second transfer transistor 203. The first transfer transistor 202 controls the electric charges transferred from the photoelectric conversion portion 201. One end of the second transfer transistor 203 is connected to the first transfer transistor 202, and the other end thereof is connected to the input node. The second transfer transistor 203 controls the electric charges transferred from the photoelectric conversion portion 201, and also controls a capacity value of the input node. The selection transistor 207 selectively connects the amplification transistor 206 and the vertical output line 208. Then, the selection transistor 207 outputs a signal from the amplification transistor 206 to the vertical output line 208 at a synchronized timing with that of the control signal output from the vertical scanning circuit 102. The reset transistor 205 is connected to the input node, and can set (reset) the input node to a reset potential.

When the first transfer transistor 202 and the second transfer transistor 203 are on, and an electric charge is transferred from the photoelectric conversion portion 201 to the FD portion 204, a pixel signal voltage corresponding to the amount of electric charge of the FD portion 204 is output to the source of the amplification transistor 206.

Figure 3A:
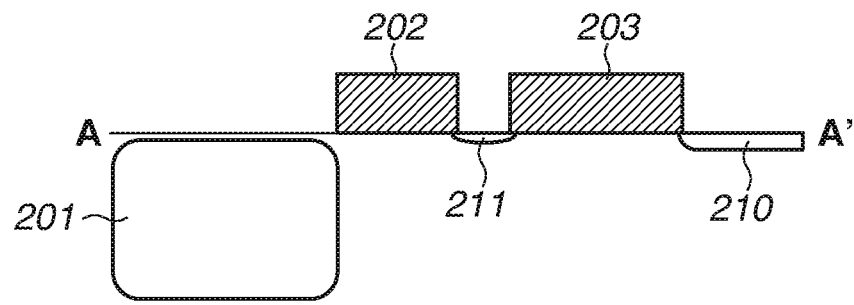
FIGS. 3A, 3B, and 3C are diagrams schematically illustrating cross-sectional views and a potential of the pixel according to the first exemplary embodiment.
Figure 3B:
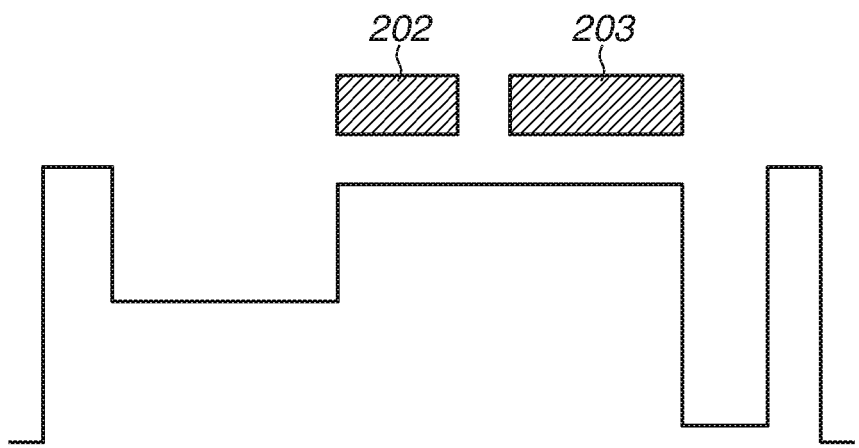
Figure 3C:
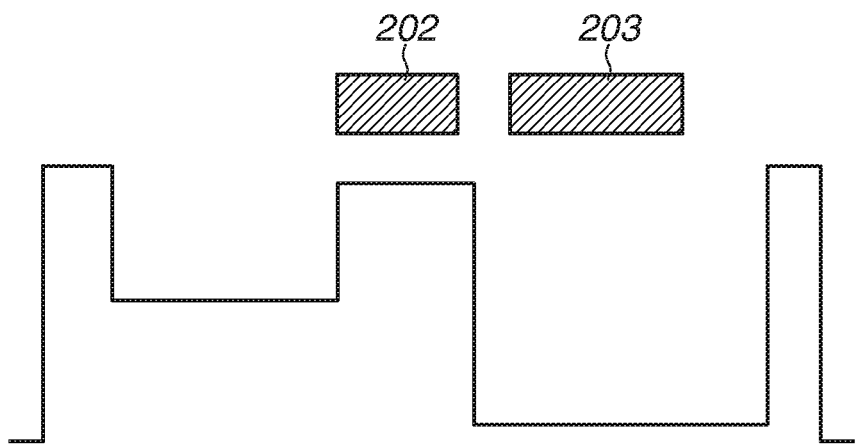

Herein, control of a capacity value of the FD portion 204 executed by the second transfer transistor 203 will be described with reference to FIGS. 3A to 3C. FIG. 3A is a schematic cross-sectional diagram illustrating the photoelectric conversion portion 201, the first transfer transistor 202, and the second transfer transistor 203. FIG. 3B is a schematic diagram of the potential when the first transfer transistor 202 and the second transfer transistor 203 are off. FIG. 3C is a schematic diagram of the potential when the first transfer transistor 202 is off and the second transfer transistor 203 is on.

As illustrated in FIG. 3A, an N-type semiconductor region (first semiconductor region) which constitutes the photoelectric conversion portion 201, an N-type semiconductor region (second semiconductor region) 210 which constitutes a part of the FD portion 204, and an N-type semiconductor region 211 are arranged on a semiconductor substrate. The N-type semiconductor region 210 is formed between the gate of the second transfer transistor 203 and the gate of the reset transistor 205 in a planar view, and constitutes a part of the FD portion 204. The N-type semiconductor region 211 is formed between the gate of the first transfer transistor 202 and the gate of the second transfer transistor 203 in a planar view.

As illustrated in FIGS. 3B and 3C, a capacity value of the FD portion 204 when the second transfer transistor 203 is turned on is greater than a capacity value thereof when the second transfer transistor 203 is turned off. When the second transfer transistor 203 is turned on, a channel is formed under the gate of the second transfer transistor 203. The N-type semiconductor region 211 is, thus, electrically connected to the N-type semiconductor region 210, so that a capacity value of the FD portion 204 is increased. Accordingly, if the second transfer transistor 203 remains in the on state when the electric charges are transferred to the FD portion 204 from the photoelectric conversion portion 201, the amount of electric charge that can be held at the PD portion 204 is increased. In other words, the capacity value of the FD portion 204 is increased. Accordingly, a voltage of the pixel signal output from the amplification transistor 206 is reduced, so that a dynamic range can be expanded. Meanwhile, if the second transfer transistor 203 remains in the off state when the electric charges are transferred to the FD portion 204 from the photoelectric conversion portion 201, the capacity of the FD portion 204 is not increased. In other words, the capacity value of the PD portion 204 is not changed from its own capacity value. Accordingly, the amount of electric charge which can be held at the FD portion 204 is small. In other words, the capacity value of the FD portion 204 is small. Therefore, a voltage of the pixel signal output from the amplification transistor 206 is increased. In this case, a voltage change amount (electric charge voltage conversion efficiency) of the FD portion 204 with respect to one electric charge can be increased. A high electric charge voltage conversion efficiency can mean a high sensitivity. Therefore, by controlling the on/off state of the second transfer transistor 203, the capacity value of the PD portion 204 can be changed, and the sensitivity thereof can be switched.

As illustrated in FIGS. 3B and 3C, the capacity of the FD portion 204 is smaller than the capacity of the photoelectric conversion portion 201. According to the present exemplary embodiment, the capacity of the FD portion 204 can be increased by the second transfer transistor 203. Therefore, the dynamic range can be expanded by increasing the own capacity of the FD portion 204.

Figure 4:
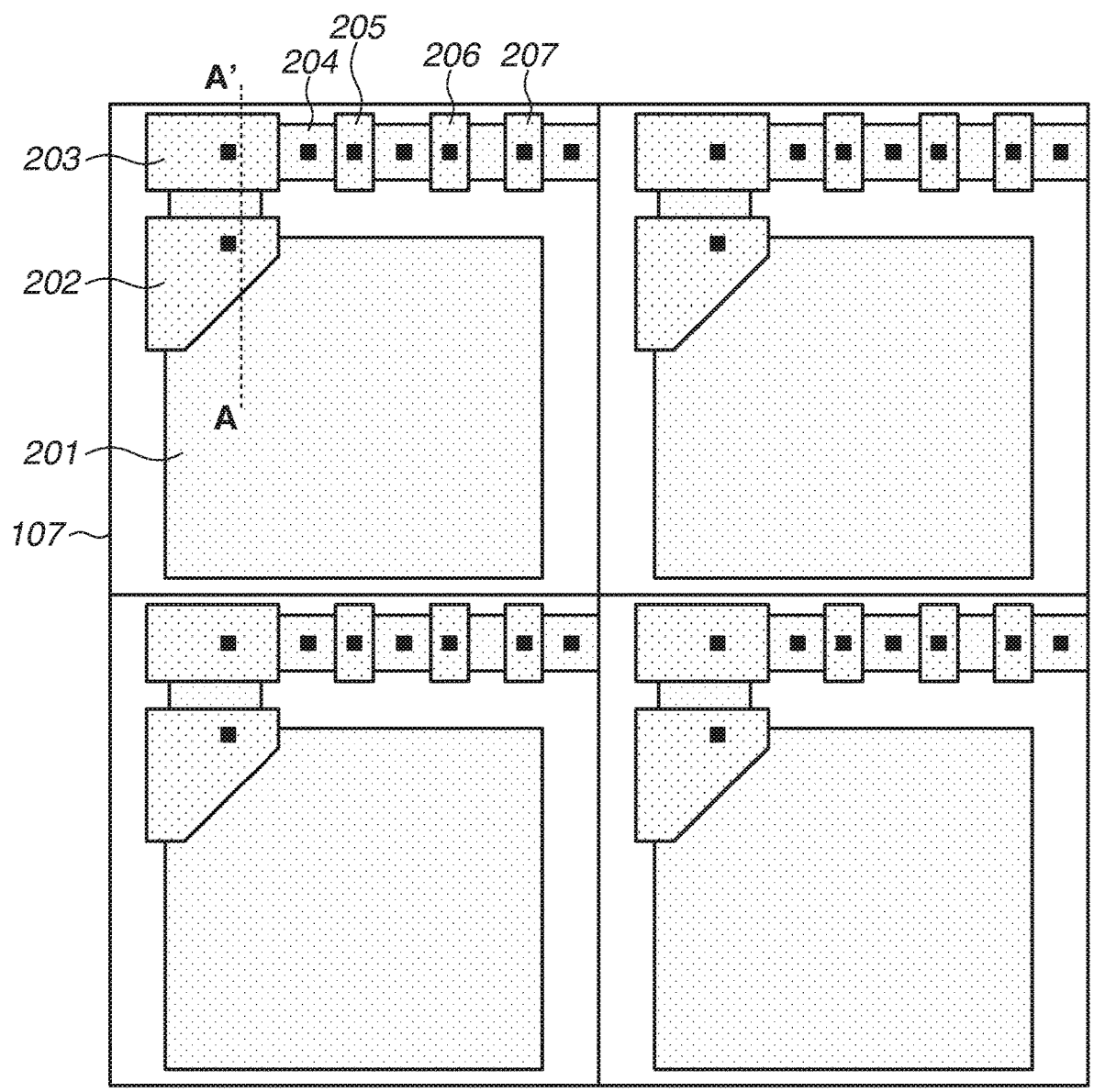
FIG. 4 is a plan view of pixels according to the first exemplary embodiment.

FIG. 4 is a schematic plan view of the pixels 107 according to the present exemplary embodiment. The same reference numerals are applied to portions corresponding to those illustrated in FIG. 2, and the descriptions of a configuration and a function already described in the above will be omitted. The cross-sectional diagram in FIG. 3A corresponds to a cross-sectional diagram taken along a line A-A' in FIG. 4. FIG. 4 illustrates contacts which electrically connect the photoelectric conversion portion 201, gates of respective transistors included in the pixel 107, and a conductive line to each other. The photoelectric conversion portion 201 and sources and drains of the respective transistors are formed inside the semiconductor substrate made of a material such as silicon (Si). Further, gates of the respective transistors are formed on a first side of the semiconductor substrate.

As illustrated in FIG. 4, the photoelectric conversion portion 201, the first transfer transistor 202, the second transfer transistor 203, the FD portion 204, and the reset transistor 205 are connected in series. With this configuration, while the reset performance of the input node is prevented from lowering, the dynamic range of the photoelectric conversion apparatus can be expanded.

A comparison example will be described with respect to a case where the FD portion 204, a control transistor for controlling increase of a capacity of the PD portion 204, and a reset transistor 205 are serially connected to each other. One end of the reset transistor 205 is connected to the control transistor, and the other end thereof is connected to the power source voltage VDD. In the comparison example, when the PD portion 204 is reset, a potential of the power source voltage VDD is supplied to the FD portion 204 via a gate of the reset transistor 205 and a gate of the control transistor. In this case, a length in a direction in which the source and the drain of the transistors are arranged (i.e., gate length) is likely to be longer than in a case where there is only a gate of the reset transistor 205. Because channel resistance is increased when the gate length is longer, there is a possibility that the reset performance is lowered. For example, lowering of the reset performance refers to a state where a time taken for stabilizing a reset level becomes longer, or a state where variation in reset potentials of the pixels is likely to occur. Although there may be possibility that lowering of the reset performance can be prevented by shortening the gate length of the reset transistor 205 and the gate length of the control transistor, increase of the capacity of the FD portion 204 may not be controlled. Therefore, with the configuration described in the comparison example, generally, the gate length cannot be shortened easily, and thus there is a possibility that the reset performance is lowered because of channel resistance.

According to the present exemplary embodiment, in contrast, the FD portion 204 and the reset transistor 205 are connected to each other in series without interposing the second transfer transistor 203 that controls the capacity value of the FD portion 204 as described above. For example, either the source or the drain of the reset transistor 205 constitutes a part of the FD portion 204. Therefore, in comparison to the configuration described in the comparison example, channel resistance occurring when the reset potential is supplied can be reduced, so that lowering of the reset performance of the input node can be suppressed.

Figure 5A:
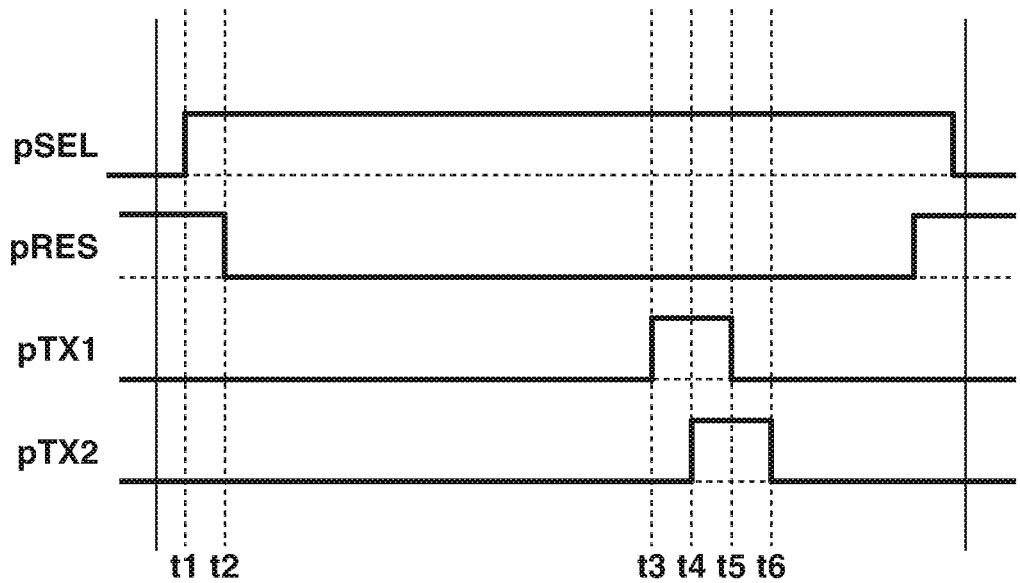
FIGS. 5A and 5B are timing charts illustrating read-out processing according to the first exemplary embodiment.
Figure 5B:
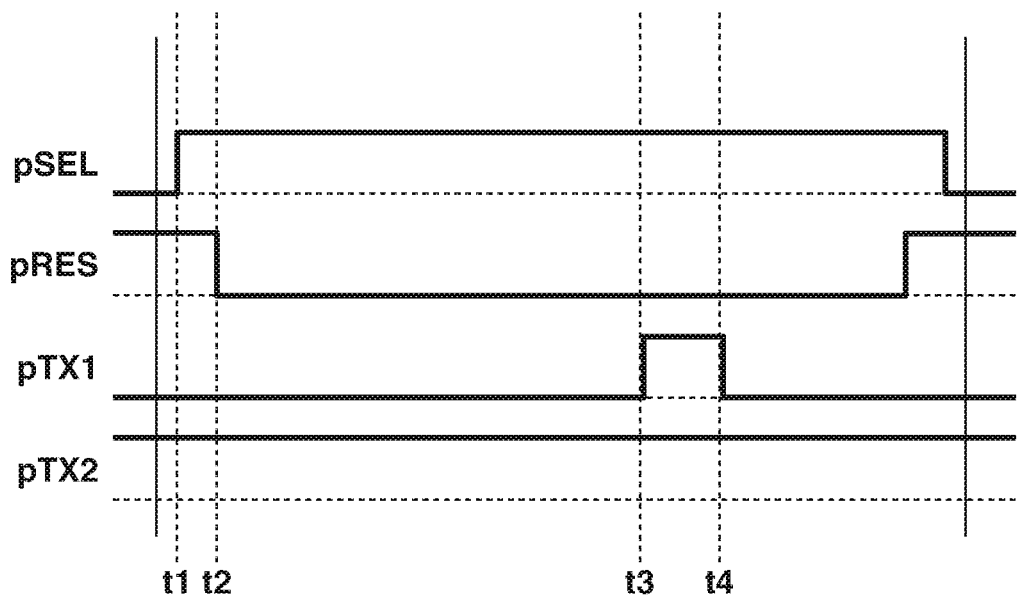

FIGS. 5A and 5B are timing charts illustrating control signals of respective transistors in the pixel 107 in FIG. 2. The horizontal axes of the timing charts represent time. FIGS. 5A and 5B illustrate states of potentials of control signals pSEL, pRES, pTX1, and pTX2 in FIG. 2. The control signal pSEL is a signal which controls the selection transistor 207, the control signal pRES is a signal which controls the reset transistor 205, the control signal pTX1 is a signal which controls the first transfer transistor 202, and the control signal pTX2 is a signal which controls the second transfer transistor 203. FIG. 5A is a timing chart when signal charges are read at a low FD capacity, and FIG. 5B illustrates a timing chart when signal charges are read at a high PD capacity. Further, FIGS. 6A to 6E are diagrams illustrating potentials at respective timings in FIG. 5A, and FIGS. 6F to 6H are diagrams illustrating potentials at respective timings in FIG. 5B.

First, with reference to FIG. 5A and FIGS. 6A to 6E, a driving method will be described with respect to the case where signal charges are read out at a low FD capacity.

Figure 6A:
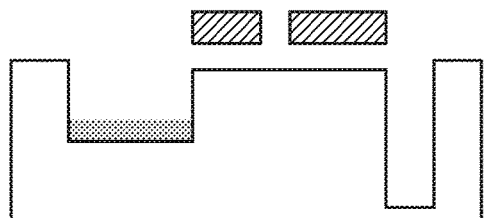
FIGS. 6A to 6H are schematic diagrams illustrating a potential in the read-out processing according to the first exemplary embodiment.

First, at a time t1, a level of the control signal pSEL is set to "High", so that the selection transistor 207 of the pixel in the read-out row is turned on. At a time t2, a level of the control signal pRES is set to "Low" from "High", so that the reset transistor 205 is switched to off from on. At this time, the second transfer transistor 203 is off. The photoelectric conversion portion 201 accumulates signal charges in a state where the first transfer transistor 202 and the second transfer transistor 203 are off. A potential in the above-described conditions is illustrated in FIG. 6A. In this state, the FD portion 204 is in a reset level at a time when the FD capacity is low, and the amplification transistor 206 reads out a potential and outputs the read potential to the vertical output line 208 as a reset signal (N-signal). A period until a time t3 can be regarded as an accumulation period in which electric charges are accumulated in the photoelectric conversion portion 201.

Figure 6F:
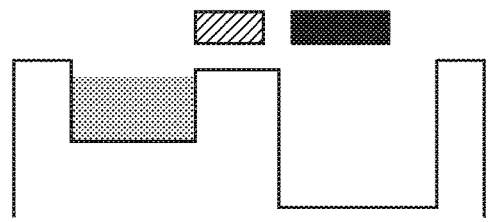
Figure 6B:
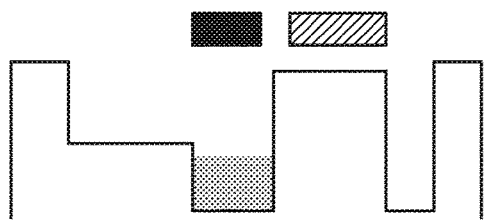

At a time t3, the control signal pTX1 is set to "High", so that the first transfer transistor 202 is turned on. At the time 3, processing for reading out signal charges from the photoelectric conversion portion 201 to the FD portion 204 is started. A potential in the above-described conditions is illustrated in FIG. 6B. As illustrated in FIG. 6B, electric charges accumulated in the photoelectric conversion portion 201 move to the underneath of the gate of the first transfer transistor 202.

Figure 6C:
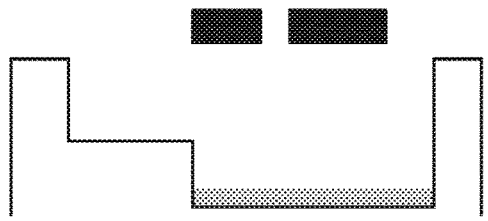

At a time t4, in a state where the first transfer transistor 202 remains in the on state, a level of the control signal pTX2 is set to "High", so that the second transfer transistor 203 is turned on. A potential in the above-described condition is illustrated in FIG. 6C. As illustrated in FIG. 6C, the electric charges accumulated in the photoelectric conversion portion 201 are transferred to the PD portion 204 where the capacity thereof is increased when the first transfer transistor 202 and the second transfer transistor 203 are turned on.

Figure 6G:
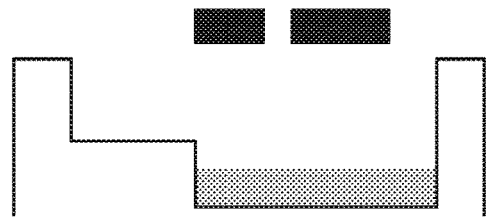
Figure 6D:
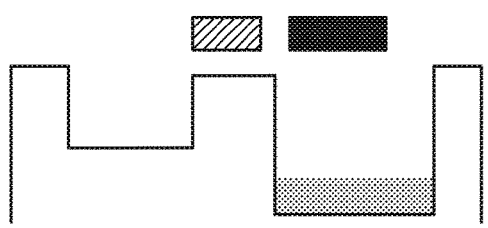

At a time t5, the control signal pTX1 is set to "Low" from "High", so that the first transfer transistor 202 is turned off. A potential in the above-described condition is illustrated in FIG. 6D. As illustrated in FIG. 6D, a potential barrier is formed between the photoelectric conversion portion 201 and the FD portion 204. As a result, signal charges are transferred to the FD portion 204 where the capacity thereof is increased by turning on the second transfer transistor 203.

Figure 6E:
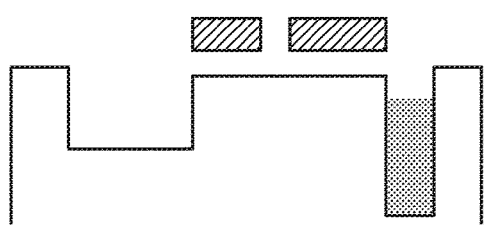

At a time t6, the control signal pTX2 is set to "Low" from "High", so that the second transfer transistor 203 is turned off. A potential barrier in the above-described condition is illustrated in FIG. 6E. As illustrated in FIG. 6E, a potential under the gate of the second transfer transistor 203 becomes higher than that in FIG. 6D, so that signal charges are retained only at the PD portion 204 where the capacity thereof is not increased by the second transfer transistor 203.

Thereafter, the amplification transistor 206 outputs a signal (S signal) according to the potential of the FD portion 204.

In addition, in FIG. 5A, timings of turning on and off the first transfer transistor 202 and timings of turning on and off the second transfer transistor 203 are shifted from each other. Specifically, the second transfer transistor 203 is turned on after the first transfer transistor 202 is turned on, and the second transfer transistor 203 is turned off after the first transfer transistor 202 is turned off. In this way, even if deviation occurs in timings of controlling the first transfer transistor 202 and the second transfer transistor 203 to be turned on/off, it is possible to easily prevent the signal charges accumulated in the photoelectric conversion portion 201 from remaining in the photoelectric conversion portion 201. The on/off timings of the first transfer transistor 202 and the second transfer transistor 203 are not limited to the timings illustrated in FIG. 5A. For example, the first transfer transistor 202 and the second transfer transistor 203 may be turned on and off at the same timings. Further, the first transfer transistor 202 may be turned on after the second transfer transistor 203 is turned on, and the second transfer transistor 203 may be turned off after the first transfer transistor 202 is turned off.

Next, with reference to FIG. 5B and FIGS. 6F to 6H, a driving method will be described with respect to a case where signal charges are read out at a high FD capacity.

At a time t1, a level of the control signal pSEL is set to "High", so that the selection transistor 207 of the pixel in the read-out row is turned on. At a time t2, the control signal pRES is set to "Low" from "High", so that the reset transistor 205 is switched to off from on. At this time, the second transfer transistor 203 is on. A potential in the above-described condition is illustrated in FIG. 6F. As illustrated in FIG. 6F, the capacity of the PD portion 204 is increased by turning on the second transfer transistor 203, so that the FD capacity becomes greater in comparison to the case illustrated in FIG. 6A. The reset processing is executed in a state where the capacity of the PD portion 204 is increased as described above. In this state, the PD portion 204 is in a reset level of the high FD capacity, and a signal thereof is read out as an N-signal. When the signal charges are read out at the high PD capacity, for example, an amount of light incident on the photoelectric conversion portion 201 is assumed to be greater than in the case where the signal charges are read out at the low FD capacity. Accordingly, the signal charges accumulated in the photoelectric conversion portion 201 is increased in comparison to the case where the signal charges are read out at the low FD capacity. For example, the amount of signal charges accumulated in the photoelectric conversion portion 201 is greater than the amount of signal charges accumulated when the FD capacity is not increased.

At a time t3, the control signal pTX1 is set to "High", so that the first transfer transistor 202 is turned on. At this time, the control signal pTX2 is "High", and the second transfer transistor 203 is on. A potential in the above-described condition is illustrated in FIG. 6G. As illustrated in FIG. 6G, the signal charges accumulated in the photoelectric conversion portion 201 are transferred to the PD portion 204 where the capacity thereof is increased.

Figure 6H:
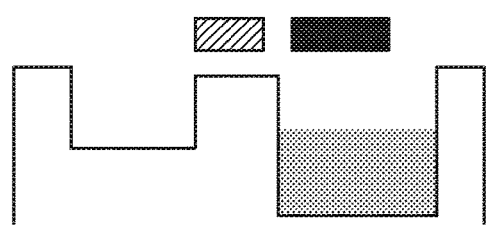

At a time t4, the control signal pTX1 is set to "Low" from "High", so that the first transfer transistor 202 is turned off. At this time, the control signal pTX 2 remains in "High", so that the second transfer transistor 203 remains in the on state. A potential in the above-described condition is illustrated in FIG. 6H. As illustrated in FIG. 6H, in a state where the capacity of the FD portion 204 is increased, a potential barrier is formed between the photoelectric conversion portion 201 and the FD portion 204.

Thereafter, in a state where the second transfer transistor 203 remains in the on state, the amplification transistor 206 outputs a signal (S-signal) according to the potential of the FD portion 204.

In FIG. 5B, the second transfer transistor 203 remains in the on state throughout the period when the signal charges are accumulated in the photoelectric conversion portion 201 and the signal reading period. However, the exemplary embodiment is not limited thereto. The second transfer transistor 203 may be on at least in a period when the N-signal is read out and in a period when the S-signal is read out. For example, the second transfer transistor 203 is turned off at the time t2 after the N-signal is read out, and turned on at a timing the same as the timing when the first transfer transistor 202 is turned on at the time t3.

By the driving methods illustrated in FIGS. 5A and 5B, the PD capacity can be changed according to the amount of light incident on the photoelectric conversion portion 201. For example, in a case where the amount of light incident on the photoelectric conversion portion 201 is a first light amount (i.e., in a case where image capturing is executed with respect to an object with low luminance), a driving method for reading out signal charges at the low FD capacity is employed, so that the amplification transistor 206 outputs a signal in a state where the second transfer transistor 203 is off. In a case where the amount of light incident on the photoelectric conversion portion 201 is a second light amount greater than the first light amount (i.e., in a case where image capturing is executed with respect to an object with high luminance), a driving method for reading out signal charges at the high FD capacity is employed, so that the amplification transistor 206 outputs a signal in a state where the second transfer transistor 203 is on. In a case where a signal charge amount is small, the driving method of reading out signal charges at the low FD capacity is employed, so that a low-noise high-sensitive signal can be read out in comparison to the case where the driving method of reading at the high FD capacity is employed. In a case where a signal charge amount is large, the driving method of reading out signal charges at the high FD capacity is employed, so that a high-saturated signal can be read out in comparison to the case where the driving method of reading at the low PD capacity is employed. Accordingly, a dynamic range of the photoelectric conversion apparatus can be expanded.

In FIG. 2, although the pixel 107 includes the selection transistor 207, the selection transistor 207 is not a required element. In a case where the pixel 107 does not include the selection transistor 207, the amplification transistor 206 outputs a signal based on the potential of the FD portion 204 to the vertical output line 208 without interposing the selection transistor 207.

Subsequently, a photoelectric conversion apparatus according to a second exemplary embodiment will be described with reference to FIG. 7. A configuration different from that of the first exemplary embodiment will be mainly described.

In the present exemplary embodiment, a different driving timing is employed in the driving method for reading out signal charges at the high FD capacity. Specifically, the second transfer transistor 203 is turned on in a pixel row (first pixel row) where the selection transistor 207 is on, and the second transfer transistor 203 is turned off in a pixel row (second pixel row) where the selection transistor 207 is off. Timings of turning on and off the second transfer transistor 203 respectively conform to timings of turning on and off the selection transistor 207. Specifically, the selection transistor 207 and the second transfer transistor 203 are turned on at the time t1 and turned off at the time t5.

According to the present exemplary embodiment, a dynamic range of the photoelectric conversion apparatus can be expanded, and a punch-through phenomenon can be also prevented from occurring between the photoelectric conversion portion 201 and the FD portion 204 of a pixel arranged in a pixel row where the selection transistor 207 is turned off.

Figure 8:
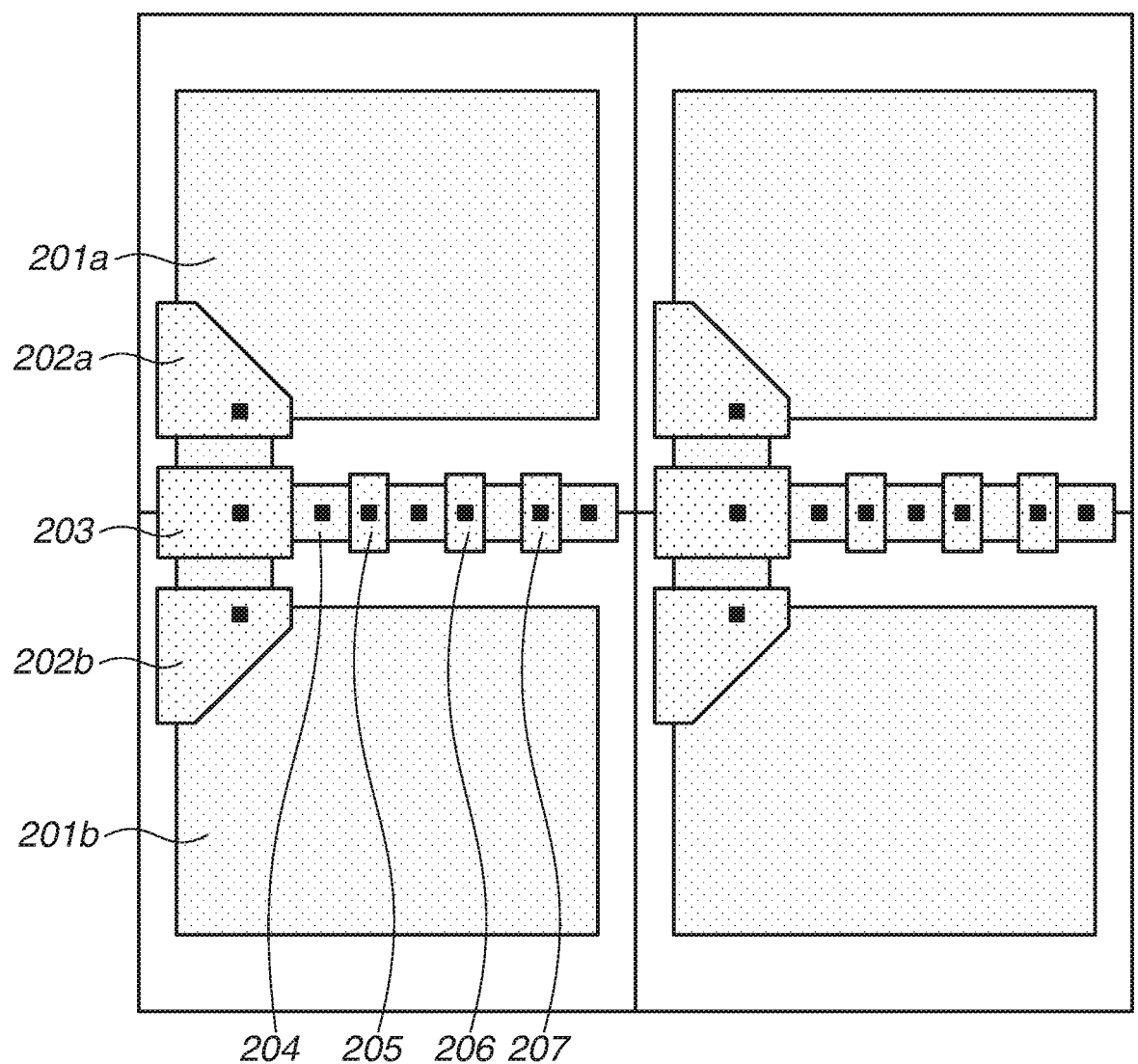
FIG. 8 is a plan view of pixels according to a third exemplary embodiment.
Figure 9:
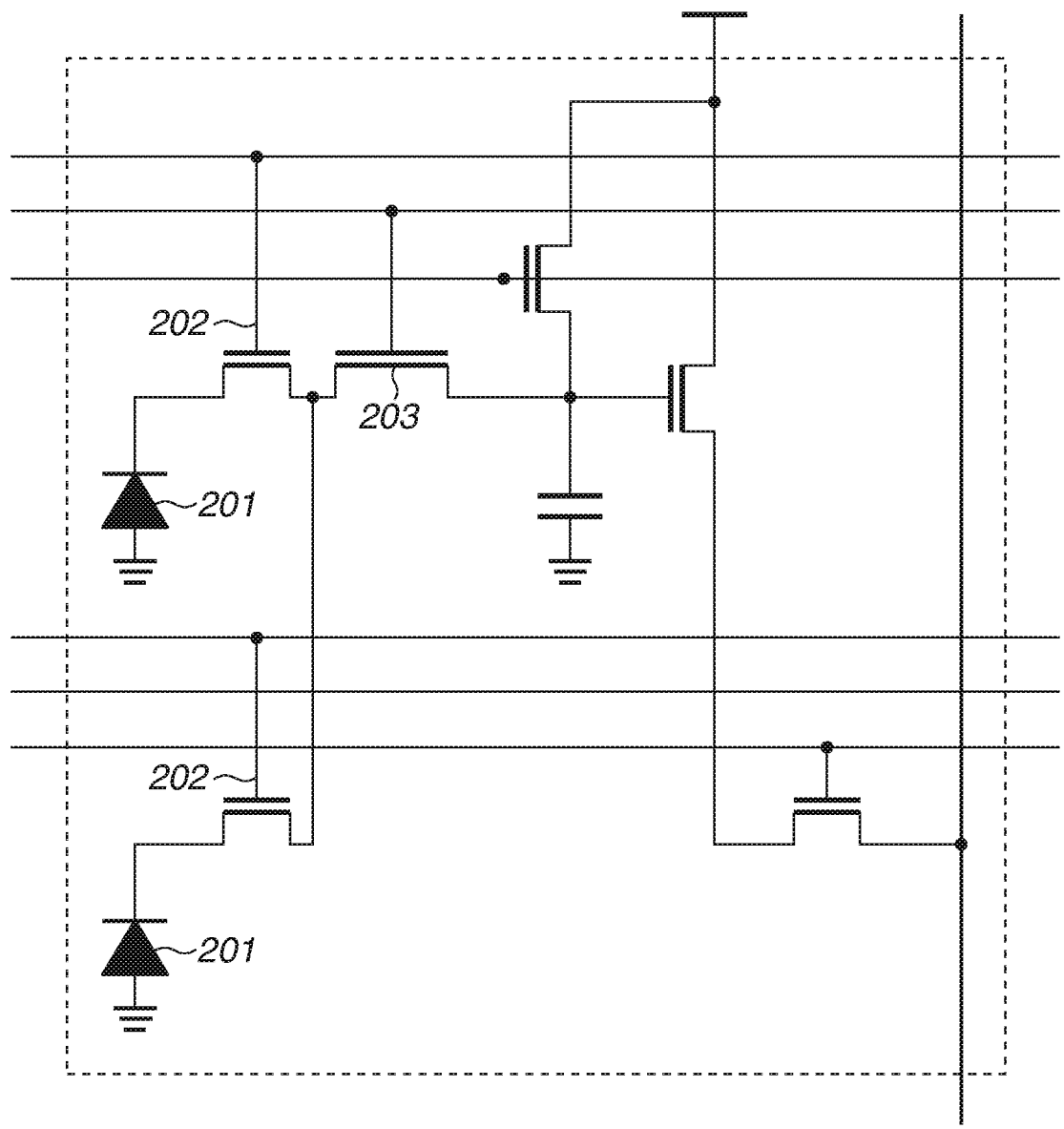
FIG. 9 is a diagram illustrating a circuit configuration of a pixel according to the third exemplary embodiment.

A photoelectric conversion apparatus according to a third exemplary embodiment will be described with reference to FIGS. 8 and 9. FIG. 8 is a plan view of pixels according to the present exemplary embodiment. FIG. 9 is a circuit diagram illustrating a pixel according to the present exemplary embodiment. Hereinafter, a configuration different from that of the first exemplary embodiment will be mainly described.

In the present exemplary embodiment, the second transfer transistor 203, the FD portion 204, the reset transistor 205, the amplification transistor 206, and the selection transistor 207 are shared by a first photoelectric conversion portion 201a and a second photoelectric conversion portion 201b. The first photoelectric conversion portion 201a and the second transfer transistor 203 are connected to each other via a first transfer transistor 202a (first first-transfer transistor). The second photoelectric conversion portion 201b and the second transfer transistor 203 are connected to each other via a first transfer transistor 202b (second first-transfer transistor).

According to the present exemplary embodiment, a gate of a single second transfer transistor 203 is in contact with the FD portion 204. Therefore, a capacity of the gate that is in contact with the FD portion 204 can be reduced in comparison to the case where a plurality of first transfer transistors is in contact with the FD portion 204, and it is possible to reduce the FD capacity.

Figure 10:
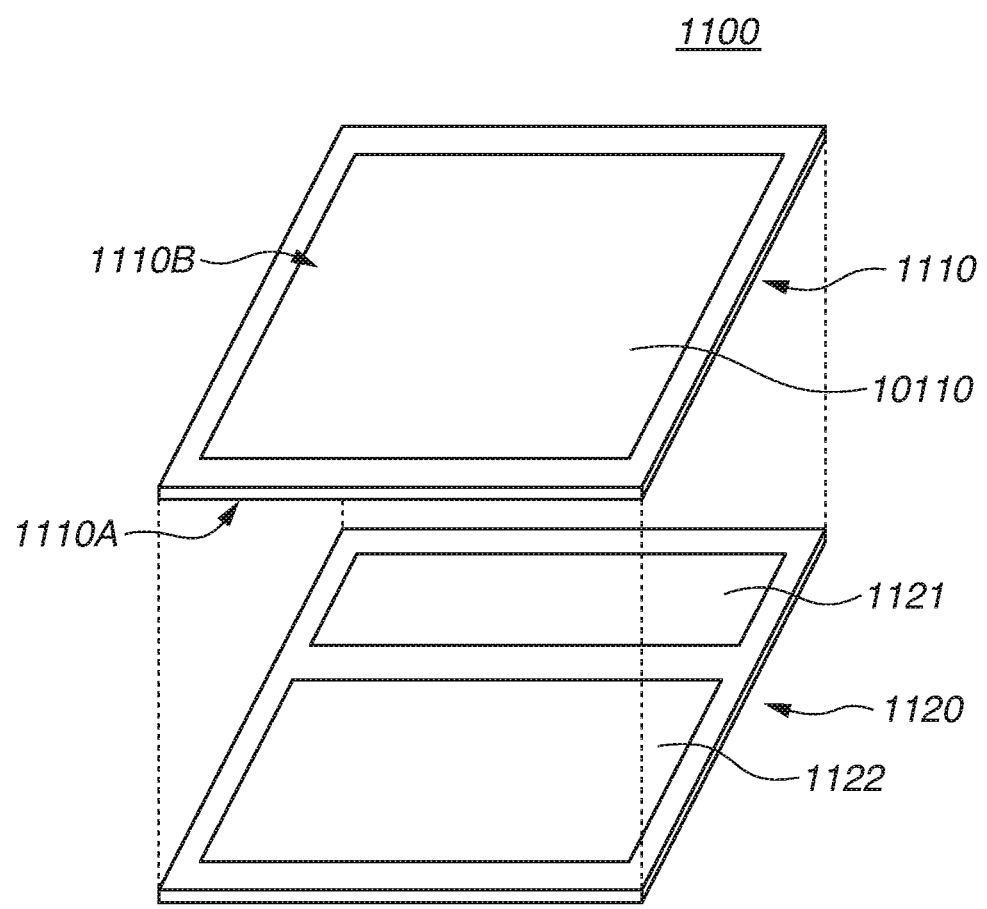
FIG. 10 is an exploded perspective diagram illustrating a photoelectric conversion apparatus according to a fourth exemplary embodiment.
Figures 11A, 11B:
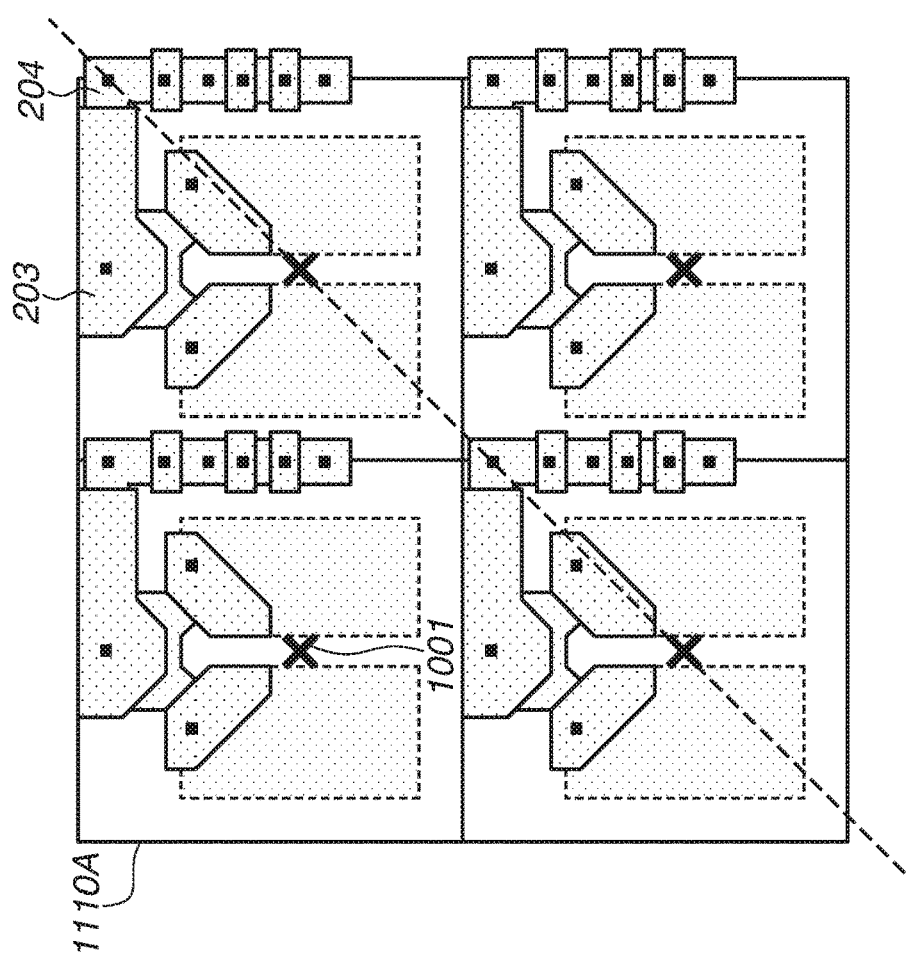
FIGS. 11A and 11B are plan views of pixels of the photoelectric conversion apparatus according to the fourth exemplary embodiment.

Next, a photoelectric conversion apparatus according to a fourth exemplary embodiment will be described with reference to FIG. 10 and FIGS. 11A and 11B. FIG. 10 is an exploded perspective diagram illustrating a photoelectric conversion apparatus 1100 according to the present exemplary embodiment. FIGS. 11A and 11B are plan views of pixels according to the present exemplary embodiment. FIG. 11A is a plan view viewed from a side (first side) 1110A of the semiconductor substrate on which the transistors are formed. FIG. 11B is a plan view viewed from a side (second side) 1110B opposite to the first side of the semiconductor substrate. Hereinafter, a configuration different from the configuration in the third exemplary embodiment will be described.

The photoelectric conversion apparatus according to the present exemplary embodiment is a back-side illumination type photoelectric conversion apparatus, on which light is incident from the second side 1110B. As illustrated in FIG. 10, a pixel array unit 10110 is arranged on a semiconductor substrate 1110. A control unit 1121 and a signal processing unit 1122 are arranged on another semiconductor substrate 1120. At least a part of an orthogonal projection of each of the control unit 1121 and the signal processing unit 1122 with respect to the semiconductor substrate 1110 overlaps with the pixel array unit 101. The photoelectric conversion apparatus 1100 according to the present exemplary embodiment may further include another semiconductor substrate including a processing circuit, and three or more semiconductor substrates may be laminated one on top of the other.

The control unit 1121 may include a vertical scanning circuit for supplying a control signal to the transistor included in the pixel and a power source circuit. The control unit 1121 may further include a timing generation circuit for driving the photoelectric conversion apparatus, a reference signal supply circuit for supplying a reference signal to a conversion circuit, and a horizontal scanning circuit for sequentially reading out a signal from an amplification circuit or a conversion circuit. For example, the control unit 1121 includes the vertical scanning circuit 102, the horizontal scanning circuit 104, and the control circuit 106 in FIG. 1.

The signal processing unit 1122 processes an electric signal based on a signal charge generated in a pixel region. A noise removal circuit, an amplification circuit, a conversion circuit, and an image signal processing circuit can be included in the signal processing unit 1122. For example, the noise removal circuit is a correlated double sampling (CDS) circuit, and the amplification circuit is a column amplifier circuit. The conversion circuit is, for example, an analog-to-digital conversion (ADC) circuit including a comparator and a counter. For example, the image signal processing circuit includes a memory and a processor, and generates image data from a digital signal converted through analog-to-digital conversion and executes image processing on the image data. For example, the signal processing unit 1122 includes the reading circuit 103 in FIG. 1.

Each of FIGS. 11A and 11B illustrates an optical center 1001 of a micro lens in a planar view. A unit cell includes two photoelectric conversion portions. In the present exemplary embodiment, photoelectric conversion portions and a reading circuit for reading from the photoelectric conversion portions corresponding to one optical center are collectively defined as a unit cell. For example, as illustrated in FIGS. 11A and 11B, the unit cell includes two photoelectric conversion portions overlapping with the micro lens in a planar view, first transfer transistors that control transfer of electric charges from the respective photoelectric conversion portions, a second transfer transistor, an amplification transistor, and a reset transistor.

As illustrated in FIG. 11A, the PD portion 204 connected to the second transfer transistor 203 is arranged at a position farthest from the optical center 1001 in the unit cell. For example, the FD portion 204 is formed at a corner of the unit cell. As described above, light is incident on the back side in the back-side illumination type photoelectric conversion apparatus. Thus, if the FD portion 204 is close to the optical center 1001, there is a high possibility that signal charges photoelectrically converted by the photoelectric conversion portions flow into the PD portion 204, which can cause lowering of sensitivity and asymmetricity in the incident angle characteristics of the sensitivity.

In the comparison example in which the second transfer transistor is not employed, in a case where the FD portion is shared by a plurality of photoelectric conversion portions, there arises considerable restrictions on the planar arrangement of the FD portion because the FD portion constitutes a part of the first transfer transistor. On the contrary, in the configuration according to the present exemplary embodiment where the second transfer transistor is added thereto, the FD portion can be arranged with a higher degree of freedom even in a case where the FD portion is shared by a plurality of photoelectric conversion portions.

FIG. 12 is a block diagram illustrating a configuration of a photoelectric conversion system 1200 according to a fifth exemplary embodiment. The photoelectric conversion system 1200 according to the present exemplary embodiment includes a photoelectric conversion apparatus 1204. Herein, any of the photoelectric conversion apparatuses described in the above-described exemplary embodiments can be used as the photoelectric conversion apparatus 1204. For example, the photoelectric conversion system 1200 can be used as an image capturing system. Specific examples of the photoelectric conversion system 1200 include a digital still camera, a digital camcorder, and a monitoring camera. In FIG. 12, a digital still camera is illustrated as an example of the photoelectric conversion system 1200.

The photoelectric conversion system 1200 in FIG. 12 includes the photoelectric conversion apparatus 1204, a lens 1202 for forming an optical image of an object on the photoelectric conversion apparatus 1204, an aperture 1203 for changing the amount of light passing through the lens 1202, and a barrier 1201 for protecting the lens 1202. The lens 1202 and the aperture 1203 function as an optical system which collects light to the photoelectric conversion apparatus 1204.

The photoelectric conversion system 1200 includes a signal processing unit 1205 for processing a signal output from the photoelectric conversion apparatus 1204. The signal processing unit 1205 executes signal processing for executing various types of correction and compression on an input signal as necessary and outputting the processed signal. The photoelectric conversion system 1200 further includes a buffer memory unit 1206 for temporarily storing image data and an external interface unit (external I/F unit) 1209 for communicating with an external computer. Furthermore, the photoelectric conversion system 1200 includes a recording medium 1211, such as a semiconductor memory, used for recording or reading captured image data and a recording medium control I/F unit 1210 for executing recording or reading processing on the recording medium 1211. The recording medium 1211 may be built into the photoelectric conversion system 1200, or may be detachably attached to the photoelectric conversion system 1200. Further, the recording medium control I/F unit 1210 may wirelessly communicate with the recording medium 1211 and the external I/F unit 1209.

The photoelectric conversion system 1200 further includes a general control/calculation unit 1208 for executing various calculations and controlling the entirety of the digital still camera and a timing generation unit 1207 for outputting various timing signals to the photoelectric conversion apparatus 1204 and the signal processing unit 1205. Herein, a timing signal may be received from an external unit, and the photoelectric conversion system 1200 may include at least the photoelectric conversion apparatus 1204 and the signal processing unit 1205 for processing the output signal output from the photoelectric conversion apparatus 1204. As described in the fourth exemplary embodiment, the timing generation unit 1207 may be mounted on the photoelectric conversion apparatus 1204. The general control/calculation unit 1208 and the timing generation unit 1207 may be configured to execute all or a part of the control function of the photoelectric conversion apparatus 1204.

The photoelectric conversion apparatus 1204 outputs an image signal to the signal processing unit 1205. The signal processing unit 1205 executes predetermined signal processing on the image signal output from the photoelectric conversion apparatus 1204 and outputs image data. The signal processing unit 1205 also generates an image by using the image signal. In addition, the signal processing unit 1205 and the timing generation unit 1207 may be mounted on the photoelectric conversion apparatus 1204. In other words, the signal processing unit 1205 and the timing generation unit 1207 may be mounted on a substrate where pixels are arranged, or may be mounted on another substrate as described in the third exemplary embodiment. By constituting an image capturing system using the photoelectric conversion apparatus according to any one of the above-described exemplary embodiments, an image capturing system capable of acquiring an image with higher quality can be realized.

Figure 13A:
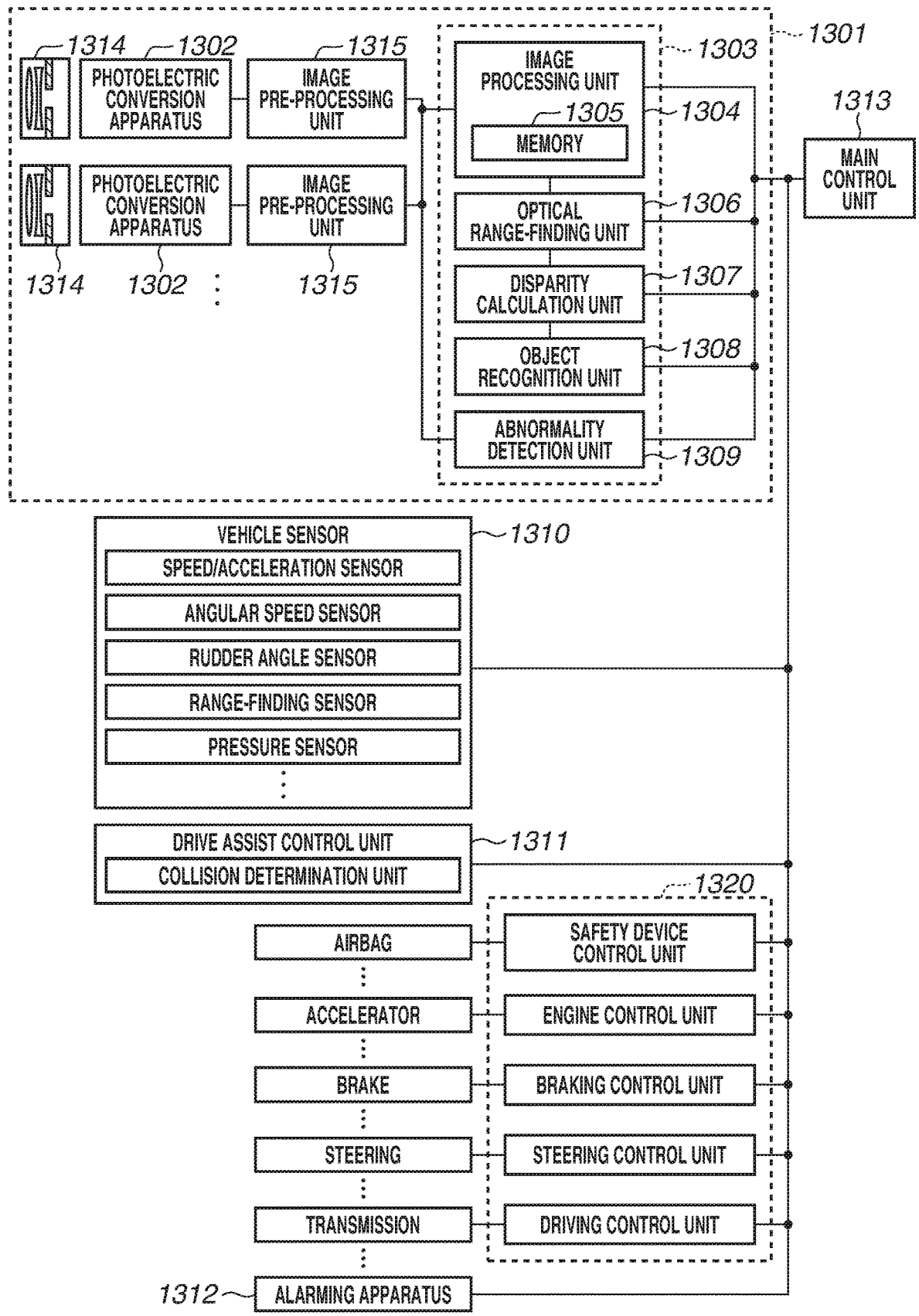
Figure 14:
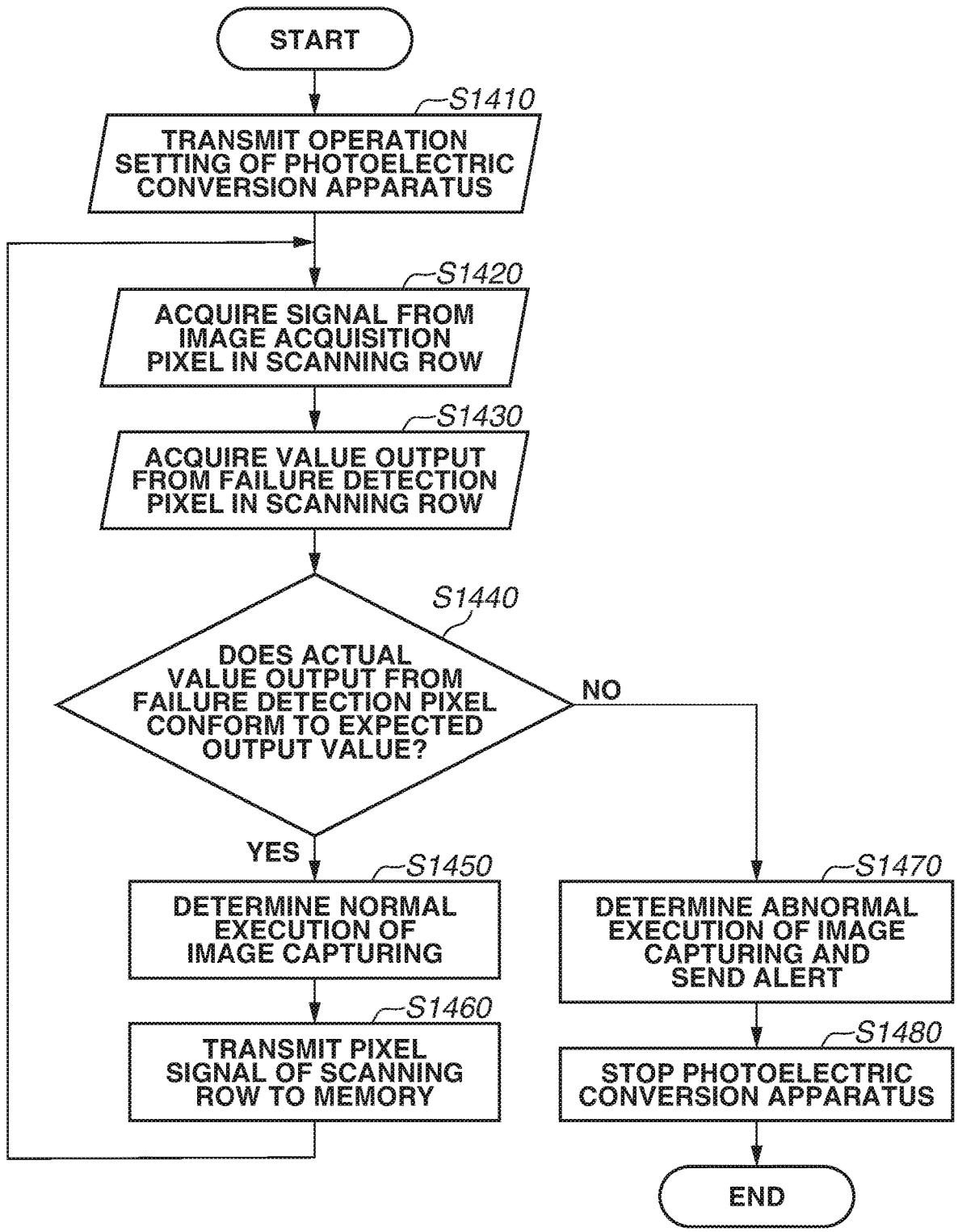
FIG. 14 is a flowchart illustrating processing of the photoelectric conversion system according to the sixth exemplary embodiment.

A photoelectric conversion system and a moving body according to a sixth exemplary embodiment will be described with reference to FIGS. 13A, 13B, and 14. FIGS. 13A and 13B are diagrams schematically illustrating configuration examples of the photoelectric conversion system and the moving body according to the present exemplary embodiment. FIG. 14 is a flowchart illustrating processing of the photoelectric conversion system according to the present exemplary embodiment. In the present exemplary embodiment, an in-vehicle camera will be described as an example of the photoelectric conversion system.

FIGS. 13A and 13B are diagrams illustrating examples of a vehicle system and a photoelectric conversion system for executing image capturing, mounted on the vehicle system. A photoelectric conversion system 1301 includes a photoelectric conversion apparatus 1302, an image pre-processing unit 1315, an integrated circuit 1303, and an optical system 1314. The optical system 1314 forms an optical image of an object on the photoelectric conversion apparatus 1302. The photoelectric conversion apparatus 1302 converts the optical image of the object formed by the optical system 1314 to an electric signal. The photoelectric conversion apparatus 1302 is the photoelectric conversion apparatus according to any one of the above-described exemplary embodiments. The image pre-processing unit 1315 executes predetermined signal processing on the signal output from the photoelectric conversion apparatus 1302. Functions of the image pre-processing unit 1315 may be embedded in the photoelectric conversion apparatus 1302. At least two sets of components, each of which includes the optical system 1314, the photoelectric conversion apparatus 1302, and the image pre-processing unit 1315, are arranged on the photoelectric conversion system 1301, and signals output from the image pre-processing units 1315 of respective sets are input to the integrated circuit 1303.

The integrated circuit 1303 is an integrated circuit directed to use for an image capturing system, and includes an image processing unit 1304 including a memory 1305, an optical range-finding unit 1306, a disparity calculation unit 1307, an object recognition unit 1308, and an abnormality detection unit 1309. The image processing unit 1304 executes image processing, such as development processing and defect correction processing, with respect to a signal output from the image pre-processing unit 1315. The memory 1305 temporarily stores a captured image, and stores a defect position of an image capturing pixel. The optical range-finding unit 1306 executes focusing and range-finding processing of the object. The disparity calculation unit 1307 calculates disparity information (a phase difference of disparity images) from a plurality of pieces of image data acquired by the plurality of photoelectric conversion apparatuses 1302. The object recognition unit 1308 executes recognition of objects such as a vehicle, a street, a traffic sign, and a person. The abnormality detection unit 1309 detects abnormality of the photoelectric conversion apparatus 1302 to notify a main control unit 1313 of the abnormality.

The integrated circuit 1303 may be realized by the hardware designed for dedicated use or a software module, or may be realized by a combination thereof. Further, the integrated circuit 1303 may be realized by a field programmable gate array (FPGA) or an application specific integrated circuit (ASIC), or may be realized by a combination thereof.

The main control unit 1313 manages and controls the operations executed by the photoelectric conversion system 1301, a vehicle sensor 1310, and a control unit 1320. For example, a method according to a standard of the controller area network (CAN) can be also employed. In this method, instead of using the main control unit 1313, each of the photoelectric conversion system 1301, the vehicle sensor 1310, and the control unit 1320 individually includes a communication interface and executes transmission and reception of the control signal via a communication network.

The integrated circuit 1303 has functions of transmitting a control signal or a setting value to the photoelectric conversion apparatus 1302 by receiving a control signal from the main control unit 1313 or by a control unit thereof.

The photoelectric conversion system 1301 is connected to the vehicle sensor 1310, and can detect a running condition of its own vehicle (e.g., a vehicle speed, a yaw rate, and a rudder angle), an environment outside its own vehicle, and a state of another vehicle or an obstacle. The vehicle sensor 1310 also serves as a distance information acquisition unit which acquires distance information indicating a distance to a target object from a parallax image. Further, the photoelectric conversion system 1301 is connected to a drive assist control unit 1311 which executes various drive assisting functions, such as an auto-steering function, an auto-cruising function, and a collision prevention function. Particularly, regarding a collision determination function, a collision determination unit estimates or determines occurrence of collision with another vehicle or an obstacle based on the detection results acquired by the photoelectric conversion system 1301 and the vehicle sensor 1310. With the above-described functions, collision-avoidance control is executed in a case where occurrence of collision is expected, and a safety apparatus is activated in a case where collision occurs.

The photoelectric conversion system 1301 is also connected to an alarming apparatus 1312 which sends an alert to a driver based on a determination result acquired by the collision determination unit. For example, in a case where the determination result acquired by the collision determination unit indicates that a chance of collision is high, the main control unit 1313 executes vehicle control for avoiding a collision or reducing damage by applying a brake, releasing an accelerator, and reducing an engine output. The alarming apparatus 1312 provides a warning by making alarm sound, displaying alarming information on a display screen of a car navigation system or a dashboard meter panel, or producing vibrations in a seat belt or a steering wheel.

In the present exemplary embodiment, the photoelectric conversion system 1301 captures images around vehicle, e.g., a forward view and a backward view of a vehicle. FIG. 13B is a diagram illustrating an example of arrangement of the photoelectric conversion system 1301 when a forward view of the vehicle is to be captured thereby.

The two photoelectric conversion apparatuses 1302 are arranged on a front side of the vehicle 1300. Specifically, a center line in a back-and-forth direction of the vehicle 1300 or a center line with respect to an external shape (e.g., vehicle width) is taken as a symmetrical axis, and the two photoelectric conversion apparatuses 1302 are arranged line-symmetrically with respect to the symmetrical axis, which is desirable in acquisition of information about a distance between the vehicle 1300 and a target object or determination on a chance of collision. Further, it is also desirable that each of the photoelectric conversion apparatuses 1302 be arranged not to disturb a driver's field of view when the driver visually checks the surroundings outside the vehicle 1300 from a driver's seat. It is also desirable that the alarming apparatus 1312 be arranged at a position where the alarming apparatus 1312 can easily enter the driver's field of view.

Next, a failure detection operation of the photoelectric conversion apparatus 1302 in the photoelectric conversion system 1301 will be described with reference to FIG. 14. The failure detection operation of the photoelectric conversion apparatus 1302 is executed according to steps S1410 to S1480 illustrated in FIG. 14.

In step S1410, a setting for starting the photoelectric conversion apparatus 1302 is executed. In other words, an operation setting of the photoelectric conversion apparatus 1302 is transmitted from an external portion (e.g., the main control unit 1313) or an internal portion of the photoelectric conversion system 1301, so that an image capturing operation and a failure detection operation of the photoelectric conversion apparatus 1302 are started.

Next, in step S1420, the photoelectric conversion system 1301 acquires a pixel signal from an effective pixel. Further, in step S1430, the photoelectric conversion system 1301 acquires a value output from a failure detection pixel arranged for the failure detection. Similar to the effective pixel, the failure detection pixel also includes a photoelectric conversion portion. A predetermined voltage is written into this photoelectric conversion portion. The failure detection pixel outputs a signal corresponding to the voltage written into the photoelectric conversion portion. In addition, the processing in steps S1420 and S1430 may be executed in reverse order.

In step S1440, the photoelectric conversion system 1301 executes conformity/non-conformity determination of a value actually output from the failure detection pixel and an expected output value thereof. As a result of conformity/non-conformity determination in step S1440, if the actual output value conforms to the expected output value (YES in step S1440), the processing proceeds to step S1450. In step S1450, the photoelectric conversion system 1301 determines that the image capturing operation is executed normally, and the processing then proceeds to step S1460. In step S1460, the photoelectric conversion system 1301 transmits a pixel signal of the scanning row and temporarily stores the pixel signal in the memory 1305. Thereafter, the processing returns to step S1420, and the failure detection is executed continuously. On the other hand, as a result of conformity/non-conformity determination in step S1440, if the actual output value does not conform to the expected output value (NO in step S1440), the processing proceeds to step S1470.

In step S1470, the photoelectric conversion system 1301 determines that abnormality has occurred in the image capturing operation, and sends an alert to the main control unit 1313 or the alarming apparatus 1312. The alarming apparatus 1312 displays information about detection of abnormality on a display unit. Then in step S1480, the photoelectric conversion apparatus 1302 is stopped, and processing of the photoelectric conversion system 1301 is ended.

In the present exemplary embodiment, the processing in the flowchart is repeated for each row. However, the processing in the flowchart may be repeated for a plurality of rows, or the failure detection may be executed for each frame. In step S1470, an alert may be issued to the outside of the vehicle via a wireless network.

In the above-described exemplary embodiment, although control of preventing a vehicle from colliding with another vehicle has been described as an example, the disclosure is also applicable to control of automatically driving a vehicle to follow another vehicle or control of automatically driving a vehicle not to drift from a traffic lane. Further, the photoelectric conversion system 1301 is applicable not only to a vehicle such as an automobile but also to a moving body (moving apparatus) such as a ship, an airplane, or an industrial robot. Furthermore, the photoelectric conversion system 1301 is applicable to a device such as an intelligent transportation system (ITS), which widely employs an object recognition function.

The photoelectric conversion apparatuses according to the exemplary embodiments of the disclosure may further include a color filter or a micro lens, and may be configured to acquire various types of information such as distance information. Further, although the amplification transistor is provided as a part of the source follower circuit, the amplification transistor may constitute a part of the AD conversion unit. Specifically, the amplification transistor may constitute a part of a comparator included in the AD conversion unit. Further, a part of the constituent elements of the comparator may be arranged on another semiconductor substrate.

The disclosure is not limited to the above exemplary embodiments, and many variations are possible. For example, an example in which a part of a configuration according to any of the above-described exemplary embodiments is added to or replaced with a configuration according to another exemplary embodiment is also included in the exemplary embodiments of the disclosure. Further, the above-described exemplary embodiments are merely examples embodying the disclosure, and shall not be construed as limiting the technical scope of the disclosure. In other words, the present disclosure can be realized in various ways without departing from the technical spirit or main features of the disclosure.

According to the aspect of the disclosure, lowering of the reset performance of the input node can be prevented, and, at the same time, a dynamic range of the photoelectric conversion apparatus can be expanded.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-121950, filed Jun. 28, 2019, which is hereby incorporated by reference herein in its entirety.

What is claimed is:

1. A photoelectric conversion apparatus comprising:
   a photoelectric conversion portion;
   an amplification transistor having an input node to which electric charges generated by the photoelectric conversion portion are input;
   a first transfer transistor configured to control transfer of the electric charges received from the photoelectric conversion portion;
   a second transfer transistor arranged between the first transfer transistor and the input node;
   a reset transistor connected to the input node;
   a first semiconductor region formed between the first transfer transistor and the second transfer transistor;
   a second semiconductor region formed between the second transfer transistor and the reset transistor; and
   an output line configured to output a signal from the amplification transistor,
   wherein, when electric charges are transferred from the photoelectric conversion portion to the input node, the photoelectric conversion apparatus switches a capacity value of the input node by controlling the second transfer transistor to be on or off and controlling connection between the first semiconductor region and the second semiconductor region,
   wherein the photoelectric conversion apparatus performs at least one of a first reading out in which the amplification transistor outputs a signal to the output line in a state where the second transfer transistor is off or a second reading out in which the amplification transistor outputs a signal to the output line in a state where the second transfer transistor is on,
   wherein, in a case where an amount of light incident on the photoelectric conversion portion is a first light amount, the first transfer transistor is turned on in a state where the second transfer transistor is off, and
   wherein, in a case where the amount of light incident on the photoelectric conversion portion is a second light amount greater than the first light amount, the first transfer transistor is turned on in a state where the second transfer transistor is on.

2. The photoelectric conversion apparatus according to claim 1, wherein, in a case where the amount of light incident on the photoelectric conversion portion is the second light amount, the second transfer transistor remains in the on state from a time before the first transfer transistor is turned on to a time after the first transfer transistor is turned off.

3. The photoelectric conversion apparatus according to claim 2, further comprising a selection transistor,
   wherein, in a case where the amount of light incident on the photoelectric conversion portion is the first light amount, the second transfer transistor is turned off and the first transfer transistor is turned on in a state where the selection transistor is on.

4. The photoelectric conversion apparatus according to claim 1,
   wherein a plurality of the photoelectric conversion portions is arranged in a first row and a second row different from the first row, and
   wherein, in a case where the amount of light incident on the photoelectric conversion portions is the second light amount, a plurality of the second transfer transistors connected to the photoelectric conversion portions arranged in the first row are turned on, and a plurality of the second transfer transistors connected to the photoelectric conversion portions arranged in the second row are turned off.

5. The photoelectric conversion apparatus according to claim 1, wherein a gate of the reset transistor is arranged between a gate of the second transfer transistor and a gate of the amplification transistor in a planar view.

6. A photoelectric conversion apparatus comprising:
   a photoelectric conversion portion;
   an amplification transistor having an input node to which electric charges generated by the photoelectric conversion portion are input;
   a first transfer transistor configured to control transfer of the electric charges received from the photoelectric conversion portion;
   a second transfer transistor arranged between the first transfer transistor and the input node;
   a reset transistor connected to the input node;
   a first semiconductor region formed between the first transfer transistor and the second transfer transistor; and
   a second semiconductor region formed between the second transfer transistor and the reset transistor,
   wherein, when electric charges are transferred from the photoelectric conversion portion to the input node, the photoelectric conversion apparatus switches a capacity value of the input node by controlling the second transfer transistor to be on or off and controlling connection between the first semiconductor region and the second semiconductor region,
   wherein the photoelectric conversion portion is arranged inside a semiconductor substrate,
   wherein a gate of the first transfer transistor is arranged on a first side of the semiconductor substrate,
   wherein a micro lens is arranged on the first side, and
   wherein, in a unit cell including the photoelectric conversion portion overlapping with the micro lens, the first transfer transistor, the second transfer transistor, the amplification transistor, and the reset transistor, a floating diffusion including the input node is arranged at a position farthest from an optical center of the micro lens in a planar view.

7. The photoelectric conversion apparatus according to claim 1,
   wherein the photoelectric conversion portion is arranged inside a semiconductor substrate,
   wherein a gate of the first transfer transistor is arranged on a first side of the semiconductor substrate,
   wherein a micro lens is arranged on the first side, and
   wherein, in a planar view, a floating diffusion including the input node is arranged in an area which does not overlap with the micro lens.

8. The photoelectric conversion apparatus according to claim 1, wherein a capacity of the input node when the second transfer transistor is off is smaller than a capacity of the photoelectric conversion portion.

9. A photoelectric conversion system comprising:
   the photoelectric conversion apparatus according to claim 1; and
   a signal processing circuit configured to process a signal output from the photoelectric conversion apparatus.

10. A moving body comprising:
    the photoelectric conversion apparatus according to claim 1;
    a distance information sensor configured to acquire distance information about a distance to a target object from disparity information based on a signal from the photoelectric conversion apparatus; and a control circuit configured to control the moving body based on the distance information.

11. The photoelectric conversion apparatus according to claim 1, wherein the photoelectric conversion apparatus performs a first reading out signal charges at a first capacity of the input node, and a second reading out signal charges at a second capacity of the input node that is larger than the first capacity.

12. A photoelectric conversion system comprising:

the photoelectric conversion apparatus according to claim 6; and a signal processing circuit configured to process a signal output from the photoelectric conversion apparatus.

13. A moving body comprising:

the photoelectric conversion apparatus according to claim 6;

a distance information sensor configured to acquire distance information about a distance to a target object from disparity information based on a signal from the photoelectric conversion apparatus; and a control circuit configured to control the moving body based on the distance information.

14. The photoelectric conversion apparatus according to claim 1, wherein a capacity of the input node is smaller than a capacity of the photoelectric conversion portion.

15. The photoelectric conversion apparatus according to claim 6, wherein a capacity of the input node is smaller than a capacity of the photoelectric conversion portion.

* * * * *